United States Patent
Ding et al.

(10) Patent No.: US 9,595,936 B2
(45) Date of Patent: Mar. 14, 2017

(54) RECONFIGURABLE BANDSTOP FILTER

(71) Applicant: INTERNATIONAL BUSINESS MACHINES CORPORATION, Armonk, NY (US)

(72) Inventors: Hanyi Ding, Colchester, VT (US); Alberto Valdes Garcia, Hartsdale, NY (US); Wayne H. Woods, Jr., Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 140 days.

(21) Appl. No.: 14/285,067

(22) Filed: May 22, 2014

(65) Prior Publication Data

US 2015/0341009 A1    Nov. 26, 2015

(51) Int. Cl.
| | |
|---|---|
| *H01P 1/203* | (2006.01) |
| *H01P 1/18* | (2006.01) |
| *H03H 7/01* | (2006.01) |
| *H03H 7/18* | (2006.01) |
| *H01P 1/20* | (2006.01) |

(52) U.S. Cl.
CPC ............ *H03H 7/0153* (2013.01); *H01P 1/20* (2013.01); *H01P 1/203* (2013.01); *H03H 7/18* (2013.01); *H01P 1/18* (2013.01); *H03H 7/185* (2013.01)

(58) Field of Classification Search
CPC .. H01P 1/203; H01P 1/20354; H01P 1/20363; H01P 1/20381; H01P 7/08; H01P 7/088
USPC .................. 333/204, 205, 219, 235
See application file for complete search history.

(56) References Cited

U.S. PATENT DOCUMENTS

| | | | | |
|---|---|---|---|---|
| 5,977,847 | A * | 11/1999 | Takahashi | ............. H01P 1/2039 333/204 |
| 6,043,727 | A * | 3/2000 | Warneke | ............... H01P 1/2039 333/205 |
| 8,106,728 | B2 | 1/2012 | Ding et al. | |
| 8,369,816 | B2 | 2/2013 | Ninan et al. | |

(Continued)

FOREIGN PATENT DOCUMENTS

| | | |
|---|---|---|
| EP | 1383236 A1 | 1/2004 |
| EP | 2464024 A2 | 6/2012 |

(Continued)

OTHER PUBLICATIONS

Uchida, et al., "A Widely-Tunable Balanced Bandstop Filter With Low Reflections and Separate Stop-bands", IEEE, Dec. 2006, 4 pages.

(Continued)

*Primary Examiner* — Robert Pascal
*Assistant Examiner* — Gerald Stevens
(74) *Attorney, Agent, or Firm* — David Cain; Andrew M. Calderon; Roberts Mlotkowski Safran, Cole & Calderon, P.C.

(57) ABSTRACT

A reconfigurable bandstop filter and methods of designing and reconfiguring the bandstop filter are disclosed. The reconfigurable bandstop filter includes a plurality of transmission lines each including a phase shifter. The reconfigurable bandstop filter further includes a signal input port having a phase shifter and a signal output port having a phase shifter. The signal input port and the signal output port is coupled to the plurality of transmission lines.

16 Claims, 6 Drawing Sheets

(56) References Cited

U.S. PATENT DOCUMENTS

| | | | | |
|---|---|---|---|---|
| 2002/0130734 A1* | 9/2002 | Liang | ............... | H01P 1/2039 333/134 |
| 2010/0237965 A1* | 9/2010 | Mi | ............ | H01P 1/2039 333/205 |
| 2012/0212304 A1 | 8/2012 | Zhang et al. | | |
| 2013/0063228 A1 | 3/2013 | Hampel et al. | | |

FOREIGN PATENT DOCUMENTS

| | | |
|---|---|---|
| WO | 2008088144 A1 | 7/2008 |
| WO | 2010063097 A1 | 6/2010 |
| WO | 2011149596 A1 | 12/2011 |

OTHER PUBLICATIONS

Huang, et al., "A Compact E-Shaped Patterned Ground Structure and Its Applications to Tunable Bandstop Resonator", IEEE, Mar. 2009, vol. 57, Issue 3, pp. 657-666.

Yan, et al., "Compact Tunable Bandstop Filter Integrated with Large Deflected Actuators", IEEE, Jun. 2007, pp. 1611-1614.

Zahari, et al., "Reconfigurable Matched Bandstop Filter", IEEE, Dec. 2011, pp. 230-233.

Hsieh, et al., "Design of Millimeter-Wave Reconfigurable Bandstop Filter Using CMOS-MEMS Technology", IEEE, Oct. 2011, pp. 534-537.

Specification and Drawings for U.S. Appl. No. 13/867,422, filed Apr. 22, 2013, 32 pages.

Specification and Drawings for U.S. Appl. No. 13/867,433, filed Apr. 22, 2013, 32 pages.

Woods et al., "CMOS Millimeter Wave Phase Shifter Based on Tunable Transmission Lines", IEEE, 2013, 4 pages.

Wang, et al., "Reconfigurable Bandstop Filter With Wide Tuning Range", Electronic Letters, 2010, vol. 46 No. 11, 2 pages.

Wang, et al., "Wideband Reconfigurable Bandstop Filter for Future Wireless Communication", 2010 Loughborough Antennas & Propagation Conference, IEEE, 2010, 4 pages.

Zhao, et al., "A Novel Reconfigurable Bandstop Filter Using FET RF Switch", IEEE, 2012, 3 pages.

Wang, et al., "A Compact Reconfigurable Bandstop Resonator Using Defected Ground Structure on Coplanar Waveguide", IEEE Antennas and Wireless Propagation Letters, vol. 11, 2012, pp. 457-459.

Uchida, et al., "A Widely-Tunable Balanced Bandstop Filter With Low Reflections and Separate Stop-bands", IEEE, Dec. 2006, Abstract.

Huang, et al., "A Compact E-Shaped Patterned Ground Structure and Its Applications to Tunable Bandstop Resonator", IEEE, Mar. 2009, vol. 57, Issue 3, Abstract.

Yan, et al., "Compact Tunable Bandstop Filter Integrated with Large Deflected Actuators", IEEE, Jun. 2007, Abstract.

Zahari, et al., "Reconfigurable Matched Bandstop Filter", IEEE, Dec. 2011, Abstract.

Hsieh, et al., "Design of Millimeter-Wave Reconfigurable Bandstop Filter Using CMOS-MEMS Technology", IEEE, Oct. 2011, Abstract.

* cited by examiner

RECONFIGURABLE BANDSTOP FILTER

FIELD OF THE INVENTION

The invention relates to semiconductor structures and, more particularly, to a reconfigurable bandstop filter and methods of designing and reconfiguring the bandstop filter.

BACKGROUND

A bandstop filter is a filter that passes most frequencies unaltered, but attenuates those in a specific range to very low levels. More specifically, a band-stop filter is an electronic filter that blocks the frequency component of a signal within a certain range value, where it has its lower cutoff frequency and upper cutoff frequency. However, the frequency component outside that range of value will be passed on.

Bandstop filters usually do not have a wide bandwidth and are constrained by their designed frequencies. As to the latter point, a bandstop filter is limited as to which frequencies can be passed. To accommodate different frequencies, it is necessary to use a different bandstop filters. Accordingly, large chip area needs to be used to accommodate different operating frequencies.

SUMMARY

In an aspect of the invention, a reconfigurable bandstop filter comprises a plurality of transmission lines each comprising a phase shifter. The reconfigurable bandstop filter further comprises a signal input port having a phase shifter and a signal output port having a phase shifter. The signal input port and the signal output port are coupled to the plurality of transmission lines.

In an aspect of the invention, a reconfigurable bandstop filter comprises a plurality of transmission lines coupled to one another. Each of the transmission lines comprises a phase shifter with discrete sections such that each of the phase shifters provided in each of the plurality of transmission lines can obtain a same characteristic impedance of Zo_A and a same length.

In an aspect of the invention, a method of reconfiguring a bandstop filter comprises: determining an initial characteristic impedance Zo_A for a specific frequency for each transmission line of the bandstop filter; determining an initial characteristic impedance Zo_B for a specific frequency for an input port and output port; determining a length needed for 90 degrees on each transmission line; and determining section lengths of each discrete section of a phase shifter for each transmission line.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the reconfigurable bandstop filter, which comprises the structures of the present invention. In still further embodiments, a method in a computer-aided design system is provided for generating a functional design model of the reconfigurable bandstop filter. The method comprises generating a functional representation of the structural elements of the reconfigurable bandstop filter.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
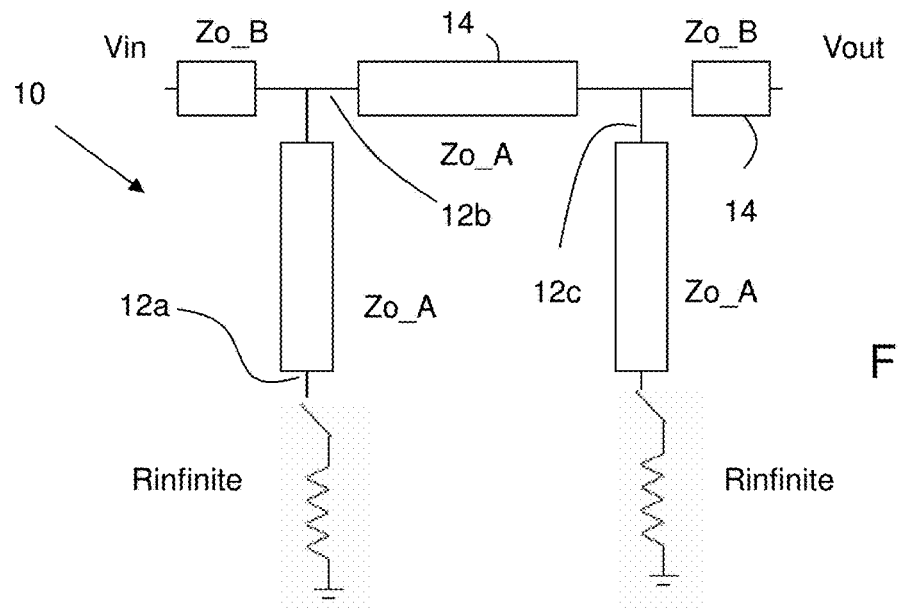
FIG. 1 shows a bandstop filter in accordance with aspects of the present invention.

The invention relates to semiconductor structures and, more particularly, to a reconfigurable bandstop filter and methods of designing and reconfiguring the bandstop filter. More specifically, the present invention is directed to a device and method that allows simple, robust reconfigurability of an on-chip Millimeter Wave (MMW) bandstop filter.

The bandstop filter of the present invention can be used in many different applications and provides many different functions. For example, the bandstop filter of the present invention can be used in suppressing interference between transmitters and receivers or general noise sources and circuits that require high isolation. That is, the bandstop filter can provide tunable isolation between transmitter's and nearby receivers by suppressing, e.g., interference. The bandstop filter can also operate as a "switchable" bandstop filter. In further applications, the bandstop filter can change frequency significantly such that only a single device is used on a chip for different operating frequencies. Also, the bandstop filter can be useful in frequency-hopping communication and jamming systems, as well as providing isolation over a wide frequency range. In this way, the bandstop filter of the present invention allows reconfigurable MMW circuits over a wide frequency range, e.g., approximately 25-55 GHz.

Advantageously, the approach of the present invention does not (i) require PIN diodes/varactor diodes (although PIN diodes/varactor diodes can be used with the present invention), (ii) place switches in the signal paths, or (iii) switch between multiple paths. Moreover, the bandstop filter can maintain constant Zo, has wide tuning range, and the potential to operate at higher frequencies than possible with other solid-state on-chip approaches. Also, the bandstop filter not only provides a considerable savings in chip area, but also allows large area circuit components to be re-used at different operating conditions and frequencies. Moreover, the bandstop filter can combat processing variation by, for example, adjusting the delays, Zo (impedance), etc. In embodiments, for example, the bandstop filter can maintain a constant operating frequency (by maintaining a substantially constant delay by the phase shifters) and vary characteristic impedance Zo, or vice versa. Also, the bandstop filter provides designers a tool towards the goal of making a "software" controlled circuit.

In embodiments, the bandstop filter comprises shunt tunable T-line phase shifter resonators. More specifically, in embodiments, the bandstop filter includes arms (transmission lines, Vin and Vout) comprising phase shifters (with discrete sections) making it possible to change the operating frequencies of the bandstop filter by a large factor, e.g., of about 3×, in controlled linear steps. For example, the bandstop filter can be reconfigured by (i) adjusting the characteristic impedance of the phase shifter on any of the transmission lines or (ii) changing the frequency of the transmission lines of the bandstop filter by approximately the same factor, or in other manners described herein.

The bandstop filter of the present invention can be manufactured in a number of ways using a number of different tools. In general, though, the methodologies and tools are used to form structures with dimensions in the micrometer or nanometer scale. The methodologies, i.e., technologies, employed to manufacture the reconfigurable bandstop filter of the present invention have been adopted from integrated circuit (IC) technology. For example, the structures of the present invention are built on wafers and are realized in films of material patterned by photolithographic processes on the top of a wafer. In particular, the fabrication of the bandstop filter of the present invention uses three basic building blocks: (i) deposition of thin films of material on a substrate, (ii) applying a patterned mask on top of the films by photolithographic imaging, and (iii) etching the films selectively to the mask.

FIG. 1 shows a bandstop filter in accordance with aspects of the present invention. In embodiments, the bandstop filter 10 includes a plurality of transmission lines (arms) 12a, 12b, and 12c. The transmission lines 12a, 12b and 12c each comprise a single phase shifter 14. In embodiments, the transmission lines associated with the phase shifters 14 each have a same characteristic impedance of, e.g., Zo_A with a 90° design. The bandstop filter 10 further includes a phase shifter 14 on the signal input port (Vin) and the signal output port (Vout), each of which have a same characteristic impedance of, e.g., Zo_B with an approximately 26° design; although other designs are contemplated by the present invention.

In embodiments, the phase shifters 14 have separately controllable inductance and controllable capacitance, where the phase shift of a section can vary without significantly affecting the constant characteristic impedance Zo_A or Zo_B of the bandstop filter 10. Accordingly, the phase shifters 14 are structured such that the bandstop filter 10 can maintain a constant characteristic impedance Zo_A (or Zo_B) while changing operating frequency up to, e.g., about 3×, or vice versa. More specifically, by using the phase shifters 14, the delay, e.g., frequency, can be varied in unison by a same ratio or percentage while maintaining constant characteristic impedance Zo_A of each transmission line. On the other hand, by using the phase shifters 14, the characteristic impedance Zo_A of each transmission line can be varied in unison by a same ratio or percentage while maintaining a constant operating frequency. In this way, the bandstop filter 10 can be tuned to block different frequency components of a signal within different range values, e.g., vary its lower cutoff frequency and upper cutoff frequency or match various input or output impedances at a given frequency.

Figure 2:
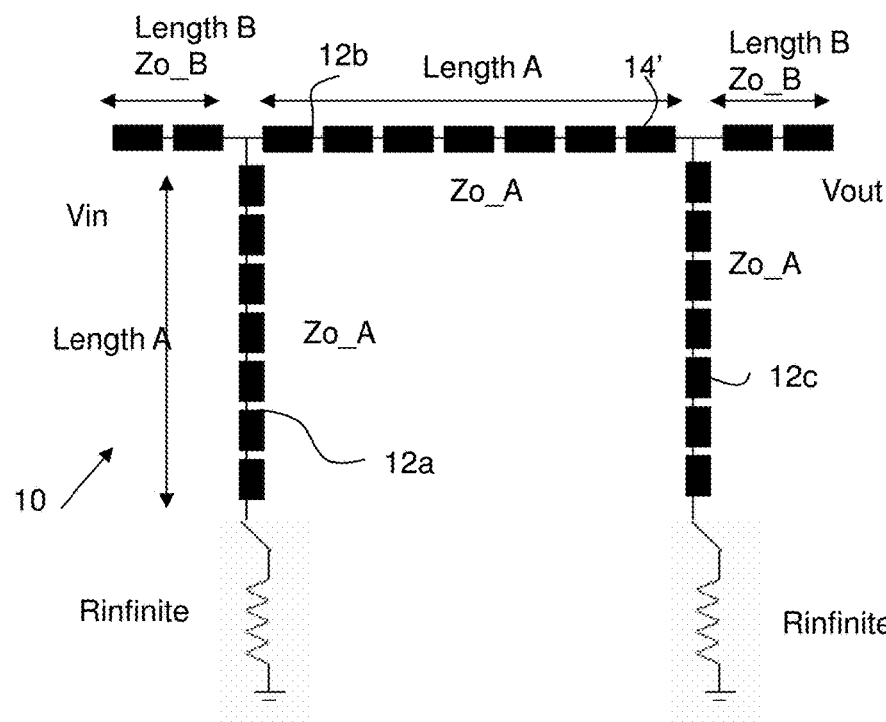
FIG. 2 shows a bandstop filter with discrete sections of a phase shifter in accordance with aspects of the present invention.

FIG. 2 shows the bandstop filter 10 with discrete sections of a phase shifter, in accordance with the present invention. More specifically, each phase shifter for each transmission line 12a, 12b and 12c of the bandstop filter 10 includes seven discrete sections 14' with a total length "A" (e.g., ¼ λ or 90°) and a same characteristic impedance Zo_A. The seven discrete sections 14' of each phase shifter in each transmission line 12a, 12b and 12c thus allows eight (8) discrete incremental steps to adjust frequency, e.g., between about 25 GHz and 55 GHz, while maintaining constant characteristic impedance; although, it should be understood by those of skill in the art that other operating frequencies and stepped increments (discrete sections 14') are contemplated by the present invention in order to provide additional fine tuning. In this way, the discrete sections 14' can provide for frequency change between f_high and f_low.

In further embodiments, the phase shifter on each of the signal input port (Vin) and the signal input port (Vout) includes two discrete sections 14' with a total length "B" (different from length "A") and a same characteristic impedance Zo_B. The two discrete sections 14' allows three (3) discrete incremental steps to adjust frequency, e.g., between about 25 GHz and 55 GHz; although, it should be understood by those of skill in the art that other operating frequencies and stepped increments (discrete sections 14') are contemplated by the present invention in order to provide additional fine tuning.

In embodiments, each discrete section 14' has at least two capacitance states and at least two inductance states, thereby being structured to have at least four permutations: (i) capacitance high, inductance high; (ii) capacitance high, inductance low; (iii) capacitance low, inductance high; and (iv) capacitance low, inductance low. With these different states, in operation, any combination of the discrete sections 14' in each transmission line 12a, 12b and 12c can be switched to incrementally adjust the delay or characteristic impedance, Zo_A. Likewise, any combination of the discrete sections 14' in Vin and Vout can be switched to incrementally adjust the delay or characteristic impedance, Zo_B. In this way, by switching discrete sections 14' of the phase shifter, the inductance (L) and capacitance (C) can be adjusted high or low, while maintaining the same characteristic impedance, Zo, for a transmission line. That is, the reconfigurable bandstop filter 10 can maintain constant characteristic impedance while changing delay in unison by a same ratio/percentage with the correct Zo_A (or Zo_B) ratio to ensure acceptable bandstop filter performance, or vice versa.

Figure 3:
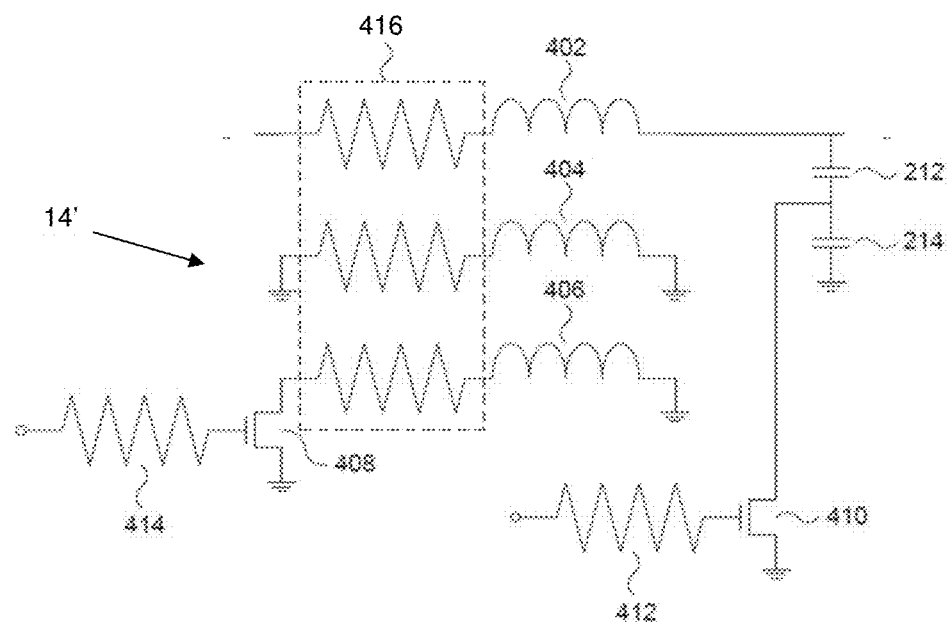
FIG. 3 is a schematic representation of a discrete section of a phase shifter in accordance with aspects of the present invention.

FIG. 3 is a schematic representation of a discrete section 14' of a phase shifter in accordance with aspects of the present invention. A detailed discussion of the phase shifter and its constituent components/sections is provided in U.S. application Ser. Nos. 13/867,433 and 13/867,422, the contents of which are incorporated by reference herein in their entirety. It should be understood by those of skill in the art that other phase shifters are also contemplated for use in the present invention.

In the circuit model of FIG. 3, each section 14' of the phase shifter includes switches 408 and 410 used to control inductance, capacitance and delay. The switches can be, for example, FETs, pin diodes, bipolar junction transistor (BJTs) or Heterojunction Bipolar Transistor (HBTs), amongst others. The capacitance 212 and 214 are representative of signal to crossing line capacitance and crossing line to ground capacitance (see, e.g., FIG. 5), which are connected by switch 410. In embodiments, each section 14' of the phase shifter further includes three inductance lines 402, 404 and 406 in series with a line resistance 416. Resistors 416 represent the inherent resistances of the signal, ground, and inductance return lines and can be determined by their materials and geometries. The inductance lines 402, 404 and 406 represent, respectively, a self inductance of a signal line, a self inductance of ground lines and self inductance of a conditional inductance line, respectively. Coupling inductances exist between these lines, with a mutual inductance between the signal line and the inductance return line, a mutual inductance between the signal line and the ground lines, and a mutual inductance between the ground lines and the inductance return line. The switch (e.g., FET) 410 controls the tunable effective signal line capacitance. Resistors 412 and 414 represent resistances that correspond to the isolation resistors used at the inputs of switches 410 and 408, respectively, e.g., 10 k ohms.

Figure 4:
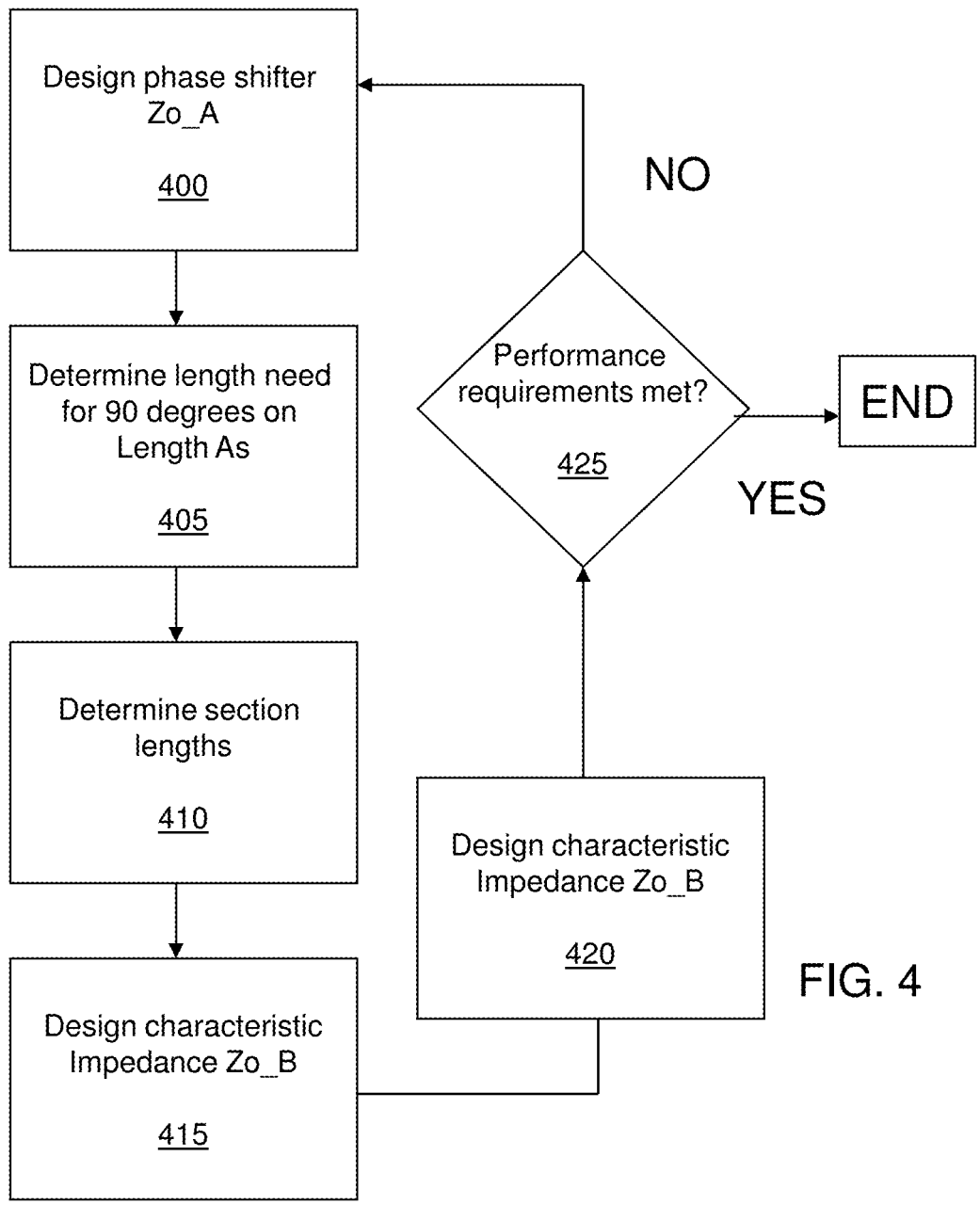
FIG. 4 shows a method of designing a reconfigurable bandstop filter in accordance with aspects of the present invention.

FIG. 4 shows a flowchart for designing a reconfigurable bandstop filter of the present invention. The flowchart of FIG. 4 illustrates the architecture, functionality, and operation of possible implementations of systems, methods, and computer program products according to various embodiments of the present invention. In this regard, each block in the flowchart may represent a module, segment, or portion of instructions, which comprises one or more executable instructions for implementing the specified logical function (s).

The flow can be implemented in any known computing infrastructure, using, for example, computer readable storage medium. For example, the computing infrastructure can be a computing device resident on a network infrastructure or computing device of a third party service provider. The computing device includes a processor (e.g., CPU), memory, an I/O interface, and a bus. The memory can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S). The computing device is in communication with external I/O device/resource and storage system. In general, processor executes computer program code (e.g., program control), which can be stored in memory and/or storage system. Moreover, in accordance with aspects of the invention, program control controls the processes described herein.

Computer readable storage medium can be a tangible device that can retain and store instructions for use by an instruction execution device, e.g., computing infrastructure. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Referring to FIG. 4, at step 400, any known automated method (see, e.g., FIG. 8 and the description thereof) is used to design the characteristic impedance Zo_A. In particular, the automated method designs the characteristic impedance Zo_A for a specific frequency and desired frequency change factor, e.g., 2× or 3×. At step 405, the process of the present invention determines a length needed for 90 degrees on each transmission line, e.g., each portion of the transmission line with a phase shifter (length A). At step 410, the process of the present invention determines section lengths of each discrete section of the phase shifter. In embodiments, the section length is determined by the length of the transmission line divided by the number of sections, e.g., (length A)/(# of sections).

At step 415, the process of the present invention designs the characteristic impedance Zo_B such that phase shift and characteristic impedance give desired performance. In embodiments, the characteristic impedance can be designed using conventional t-line design techniques or automated design methods as noted in FIG. 8, for example. At step 420, the process of the present invention can design the characteristic impedance Zo_A and Zo_B for fine tuning, if necessary, e.g., smaller section lengths and tuning range. At step 425, a determination is made as to whether all performance requirements are met, e.g., phase change, worse case loss, etc. If so, then the process ends. If not, the process reverts to step 400.

Figure 5:
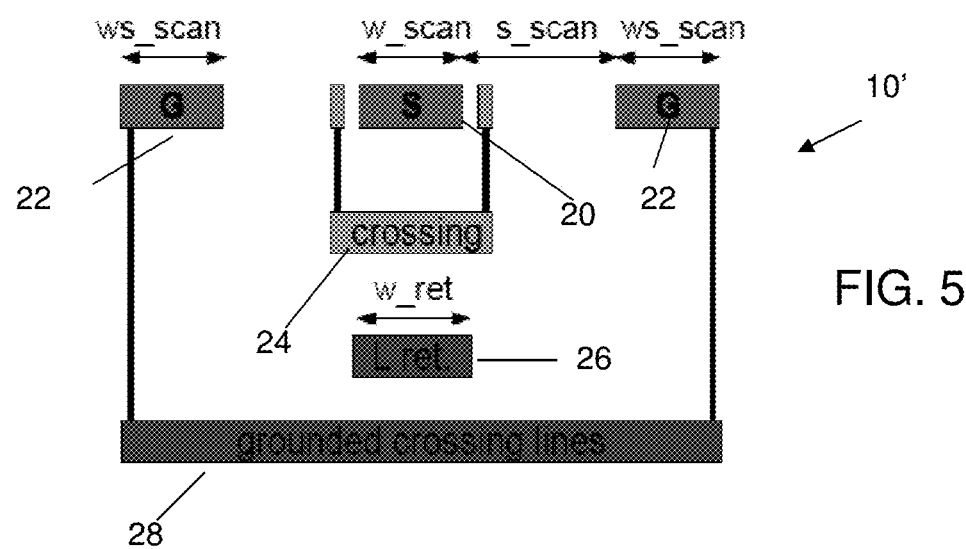
FIG. 5 shows an example cross sectional view of a phase shifter used in a bandstop filter in accordance with aspects of the present invention.

FIG. 5 shows an example cross sectional view of a phase shifter used in a bandstop filter for adjusting frequency with a, e.g., 504 μm length arm (transmission line). More specifically, FIG. 5 shows a cross section of a bandstop filter 10' which includes a signal line 20 (with a width w_scan) located between two ground lines 22 (with a width ws_scan). A distance between the signal line 20 and each ground line 22 is s_scan. A crossing line 24 is provided under the signal line 20 and an inductance return line 26 is provided under the crossing line 24. The inductance return line 26 has a width w_ret. A grounded crossing line 28 connects to the two ground lines 22. In embodiments, the inductance (L) and capacitance (C) are switched at the same time and the same rate (e.g., percentage) to change the delay of the bandstop filter noting the computations of FIG. 5, e.g., taking into consideration w_scan, ws_scan, s_scan, w_ret, capacitance (high/low) and inductance (high/low), etc. Ideally to design the bandstop filter the following approximations are taken into consideration (which can be provided through calculations using, e.g., the embodiment shown in FIG. 8):

Zo_A=Zo_B: In this example:
 Zo_A=Zo_B=approximately 37.1 Ohms.   (i)

Figure 6:
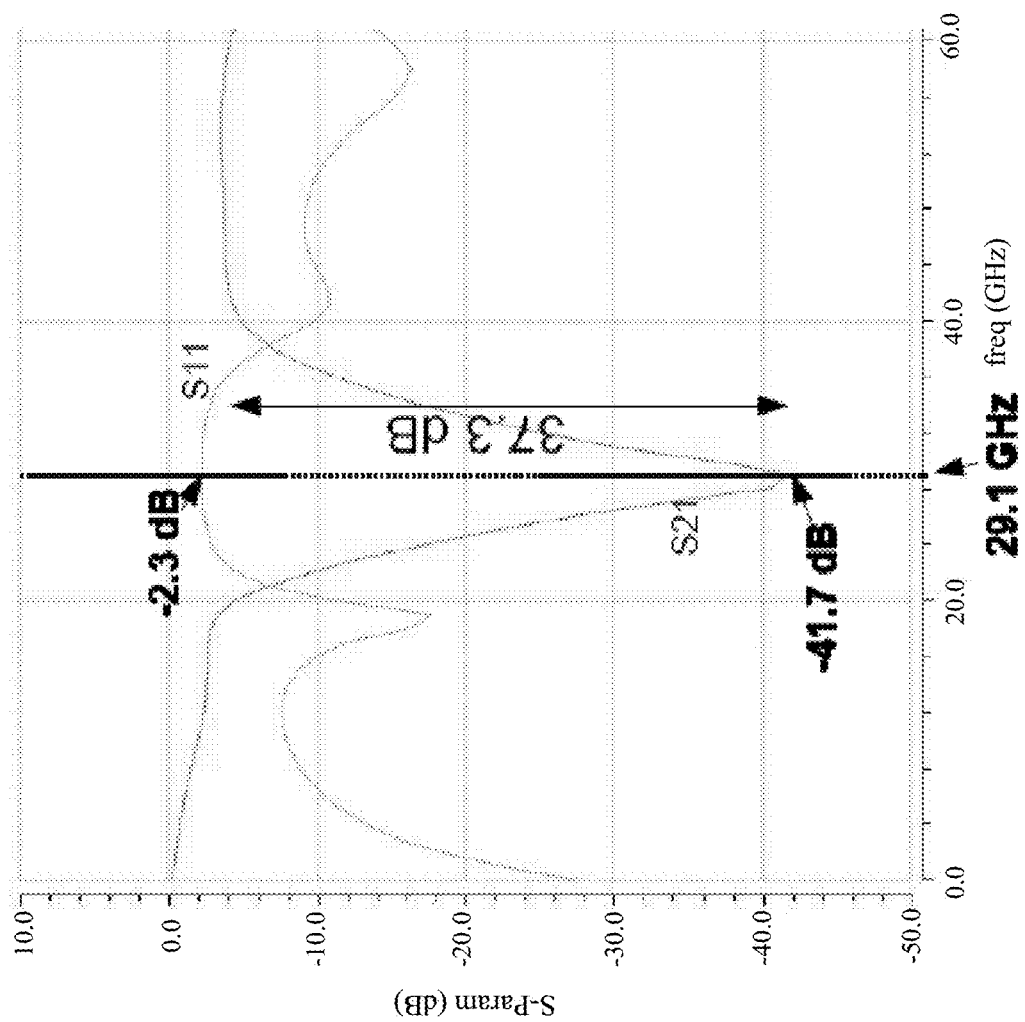
FIGS. 6 and 7 show performance graphs of simulated bandstop filters at different states.
Figure 7:
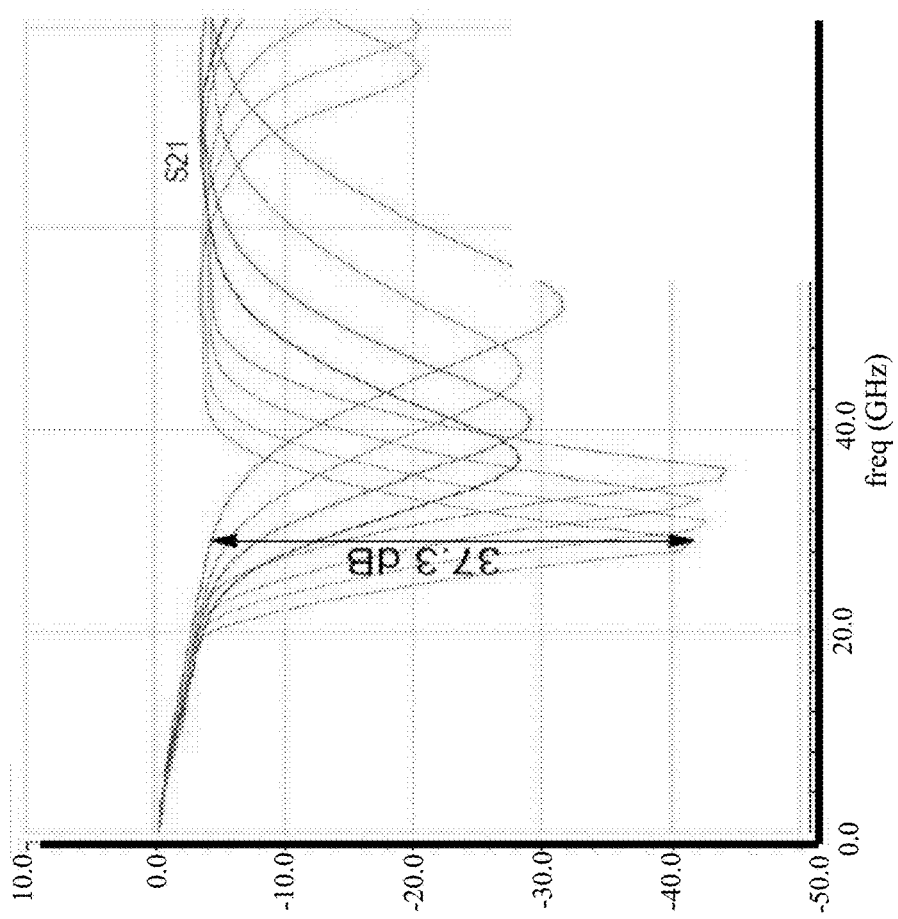

FIGS. 6 and 7 show performance graphs of simulated bandstop filters at different states, e.g., incremental states of the discrete sections of the phase shifters. In particular, FIG. 6 shows a simulation result of a 3-bit reconfigurable bandstop filter in a first state, e.g., lowest frequency with all seven sections in a high delay state (high inductance (L) and high capacitance (C)). As shown in this simulation result, the energy loss between port 2 and port 1 (line S21) (Vout and Vin, respectively) is about −41.7 dB at about 29 GHz and a reflection loss at port 1 (line S11) at about 29 Ghz, with dB loss of about −2.3 dB.

FIG. 7 shows a simulation result of a 3-bit reconfigurable bandstop filter in all 8 states, e.g., states 1-8 (e.g., the highest to lowest delay states). This graph shows that switching between state 1 and state 8 makes the bandstop filter an acceptable switch due to the large difference in the S21 loss between these states (about 37.3 dB), with all states showing acceptable isolation, e.g., below −25 dB.

Figure 8:
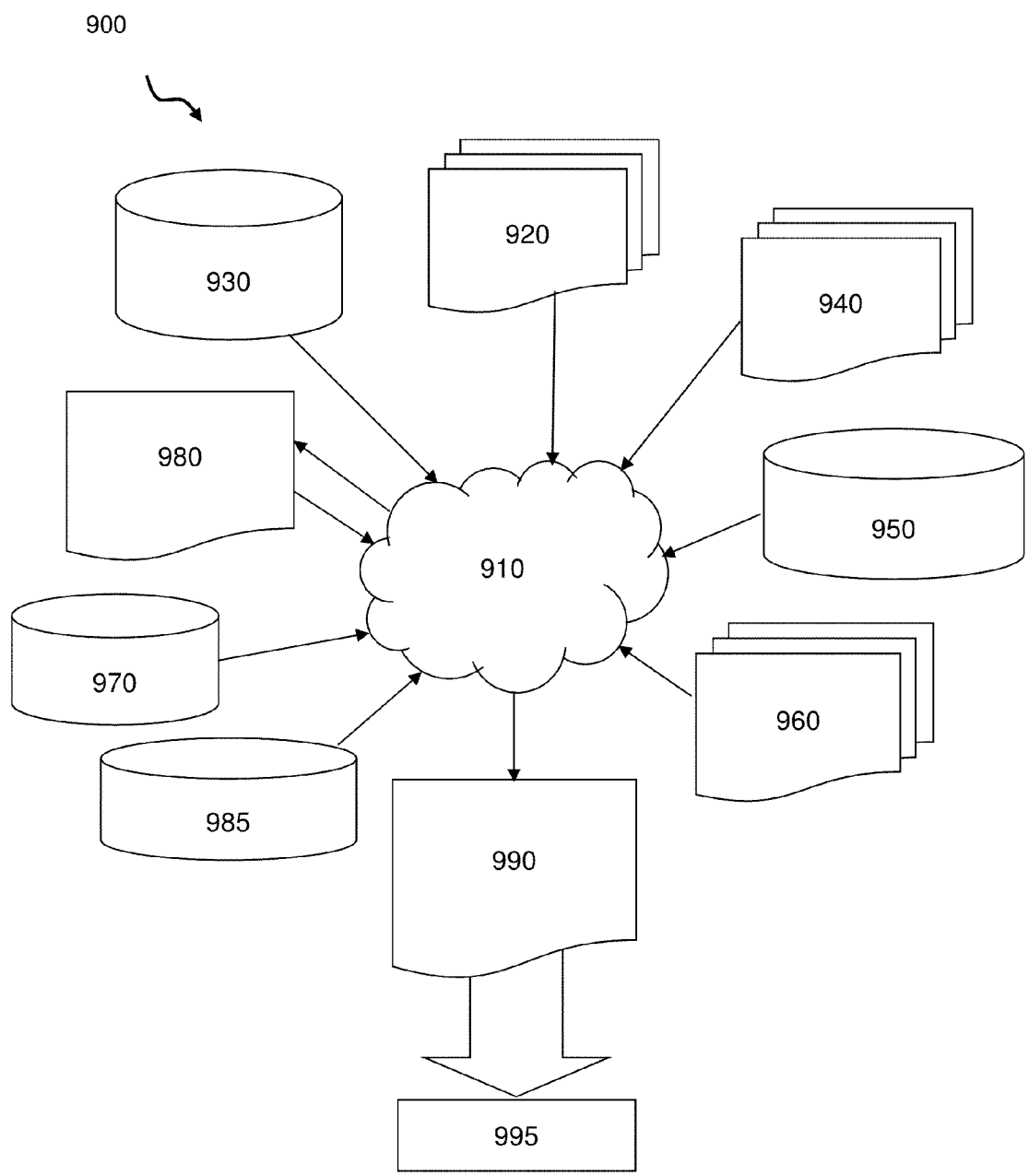
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3 and 5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3 and 5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3 and 5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3 and 5. In one embodiment, design structure 990 may comprise a compiled, executable HDL simulation model that functionally simulates the devices shown in FIGS. 1-3 and 5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3 and 5. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A reconfigurable bandstop filter, comprising:
a plurality of transmission lines each comprising a phase shifter;
a signal input port having a first phase shifter coupled to the plurality of transmission lines; and
a signal output port having a second phase shifter coupled to the plurality of transmission lines,
wherein each of the phase shifters of the plurality of transmission lines are structured to maintain a constant delay while varying characteristic impedance of each transmission line of the plurality of transmission lines.

2. The reconfigurable bandstop filter of claim 1, wherein each of the phase shifters of the plurality of transmission lines, the first phase shifter, and the second phase shifter have controllable inductance and controllable capacitance.

3. The reconfigurable bandstop filter of claim 1, wherein each of the phase shifters of the plurality of transmission lines are structured to vary a phase shift without significantly affecting a characteristic impedance of the plurality of transmission lines.

4. The reconfigurable bandstop filter of claim 1, wherein each of the phase shifters of the plurality of transmission lines are structured to maintain constant characteristic impedance while changing delay in unison of the plurality of transmission lines.

5. The reconfigurable bandstop filter of claim 1, wherein each of the phase shifters of the plurality of transmission lines vary the characteristic impedance in unison by a same ratio or percentage.

6. The reconfigurable bandstop filter of claim 1, wherein the phase shifters of the plurality of transmission lines, the signal input port and the signal output port have discrete sections structured to incrementally adjust frequency of the reconfigurable bandstop filter.

7. The reconfigurable bandstop filter of claim 6, wherein the discrete sections are structured to incrementally adjust frequency of the bandstop filter between various operating frequencies.

8. The reconfigurable bandstop filter of claim 6, wherein each of the discrete sections has two capacitance states and two inductance states, resulting in at least four permutations: (i) capacitance high, inductance high; (ii) capacitance high, inductance low; (iii) capacitance low, inductance high; and (iv) capacitance low, inductance low.

9. The reconfigurable bandstop filter of claim 6, wherein each of the discrete sections provide frequency change between a high frequency (f_high) and a low frequency (f_low).

10. The reconfigurable bandstop filter of claim 1, wherein the bandstop filter is reconfigurable into a switch.

11. The reconfigurable bandstop filter of claim 10, wherein a characteristic impedance of the transmission lines, the signal input port and the signal output port are approximately equal.

12. A reconfigurable bandstop filter, comprising a plurality of transmission lines coupled to one another, each of which comprises a phase shifter with discrete sections such that each of the phase shifters provided in each of the plurality of transmission lines can obtain a same characteristic impedance (Zo_A) and have a same length, and an input port and an output port, each of which comprises a phase shifter with discrete sections.

13. The reconfigurable bandstop filter of claim 12, wherein each of the phase shifters of the plurality of transmission lines comprises discrete sections with controllable inductance and controllable capacitance to incrementally adjust frequency of the reconfigurable bandstop filter.

14. The reconfigurable bandstop filter of claim 13, wherein each of the discrete sections has two capacitance states and two inductance states, resulting in at least four permutations: (i) capacitance high, inductance high; (ii) capacitance high, inductance low; (iii) capacitance low, inductance high; and (iv) capacitance low, inductance low.

15. The reconfigurable bandstop filter of claim 12, wherein the phase shifters of the plurality of transmission lines are structured to maintain the first constant characteristic impedance (Zo_A) while changing a frequency in each of the plurality of transmission lines.

16. The reconfigurable bandstop filter of claim 12, wherein the input port and the output port each comprises a second constant characteristic impedance (Zo_B).

\* \* \* \* \*